(12) United States Patent
Wu et al.

(10) Patent No.: US 10,734,083 B2
(45) Date of Patent: Aug. 4, 2020

(54) VOLTAGE DRIVER FOR MEMORY

(71) Applicant: eMemory Technology Inc., Hsin-Chu (TW)

(72) Inventors: Yu Wu, New Taipei (TW); Wei-Chiang Ong, Hsinchu (TW); Chih-Yang Huang, Tainan (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/113,265

(22) Filed: Aug. 27, 2018

(65) Prior Publication Data

US 2019/0115086 A1 Apr. 18, 2019

Related U.S. Application Data

(60) Provisional application No. 62/571,833, filed on Oct. 13, 2017.

(30) Foreign Application Priority Data

May 16, 2018 (TW) .............................. 107116684 A

(51) Int. Cl.
*G11C 16/30* (2006.01)
*G11C 16/04* (2006.01)
(Continued)

(52) U.S. Cl.
CPC ................ *G11C 16/30* (2013.01); *G05F 3/24* (2013.01); *G11C 16/0433* (2013.01); *G11C 16/14* (2013.01)

(58) Field of Classification Search
CPC ..... G11C 16/30; G11C 16/0433; G11C 16/14; G05F 3/24
(Continued)

(56) References Cited

U.S. PATENT DOCUMENTS

| | | | |
|---|---|---|---|
| 5,121,011 A * | 6/1992 | Ohya | .................... H03F 3/3008 326/83 |
| 5,301,151 A | 4/1994 | Wells et al. | |

(Continued)

FOREIGN PATENT DOCUMENTS

| | | |
|---|---|---|
| TW | 200802392 | 1/2008 |
| TW | 201712685 | 4/2017 |

OTHER PUBLICATIONS

Taiwan Intellectual Property Office, "Office Action", dated Oct. 11, 2018.

*Primary Examiner* — Anthan Tran
(74) *Attorney, Agent, or Firm* — WPAT, PC

(57) ABSTRACT

A voltage driver includes a voltage divider, a first transistor and a second transistor. The voltage divider is connected with a first voltage source and a second voltage source, and generates a first bias voltage. A drain terminal of the first transistor is connected with a third voltage source. A gate terminal of the first transistor is connected with the voltage divider to receive the first bias voltage. A drain terminal of the second transistor is connected with a source terminal of the first transistor. A gate terminal of the second transistor receives a second bias voltage. A source terminal of the second transistor is connected with a fourth voltage source. The first transistor and the second transistor are of the same conductivity type and match each other. The source terminal of the first transistor generates an output voltage.

5 Claims, 7 Drawing Sheets

(51) Int. Cl.
 *G05F 3/24* (2006.01)
 *G11C 16/14* (2006.01)

(58) Field of Classification Search
 USPC .................................................... 365/185.23
 See application file for complete search history.

(56) References Cited

U.S. PATENT DOCUMENTS

| | | | |
|---|---|---|---|
| 5,532,617 | A | 7/1996 | Parkinson et al. |
| 6,034,895 | A | 3/2000 | Naura et al. |
| 6,127,997 | A | 10/2000 | Tsuchi |
| 6,466,481 | B1 | 10/2002 | Pasotti et al. |
| 6,734,656 | B2 | 5/2004 | Miller et al. |
| 7,542,351 | B2 | 6/2009 | Choy et al. |
| 8,624,574 | B2 | 1/2014 | Chien et al. |
| 9,143,034 | B2 | 9/2015 | Chang |
| 2002/0113628 | A1* | 8/2002 | Ajit .......................... G11C 5/14 327/108 |
| 2005/0156854 | A1* | 7/2005 | Park ..................... G09G 3/3696 345/100 |
| 2007/0069710 | A1* | 3/2007 | Lee .......................... G05F 3/242 323/313 |
| 2008/0159039 | A1* | 7/2008 | Im .......................... G11C 5/147 365/222 |
| 2009/0147593 | A1* | 6/2009 | Jeon ...................... G11C 7/1051 365/189.07 |
| 2014/0145690 | A1* | 5/2014 | Lee .......................... G11C 5/147 323/265 |

\* cited by examiner

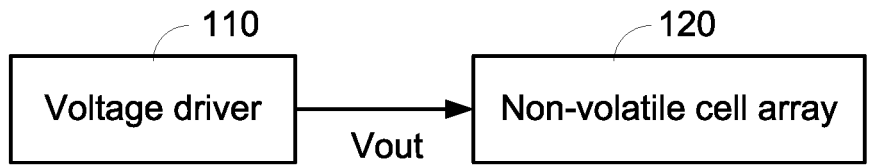
FIG. 1 (PRIOR ART)
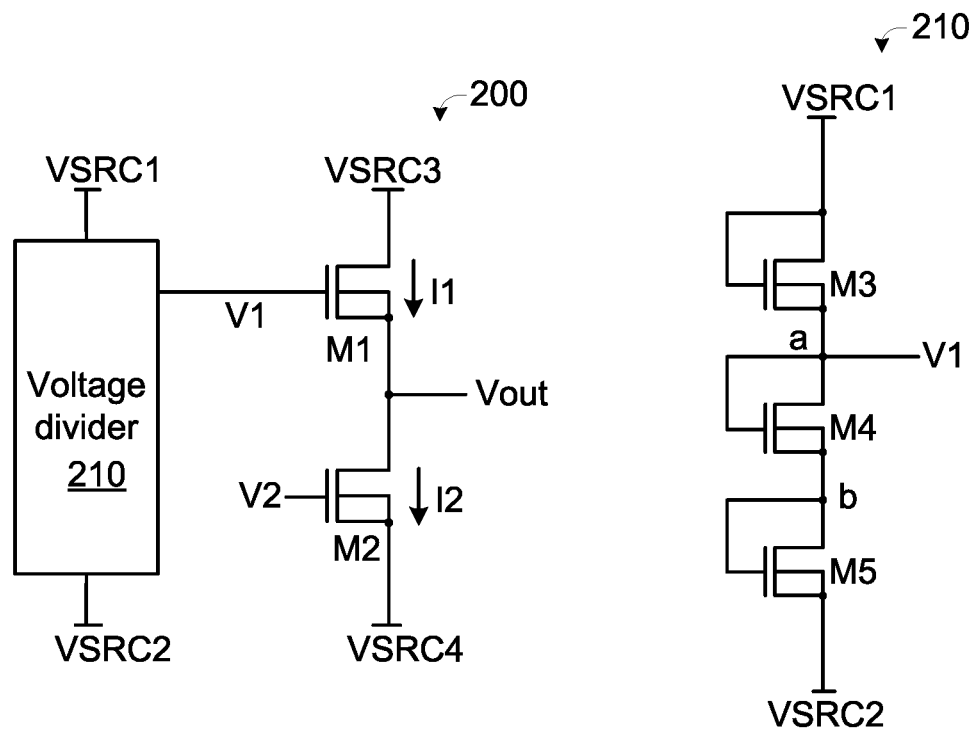
FIG. 2A
FIG. 2B

VOLTAGE DRIVER FOR MEMORY

This application claims the benefit of U.S. provisional application Ser. No. 62/571,833, filed Oct. 13, 2017 and the benefit of Taiwan Patent Application No. 107116684, filed May 16, 2018, the subject matters of which are incorporated herein by reference.

FIELD OF THE INVENTION

The present invention relates to a voltage driver, and more particularly to a voltage driver for a memory.

BACKGROUND OF THE INVENTION

As is well known, a non-volatile memory is able to continuously retain data after the supplied power is interrupted. Consequently, the non-volatile memory is widely used in a variety of electronic products. Generally, the non-volatile memory comprises a non-volatile cell array. The memory array consists of plural memory cells. In addition, each memory cell has a floating gate transistor.

FIG. 1 is a schematic functional block diagram illustrating the architecture of a non-volatile memory. As shown in FIG. 1, the non-volatile memory comprises a voltage driver 110 and a non-volatile cell array 120. The voltage driver 110 is connected with the non-volatile cell array 120. Moreover, the voltage driver 110 provides an output voltage Vout to the non-volatile cell array 120.

Generally, the non-volatile cell array 120 can be operated in different working modes. For example, the working modes include a program mode, an erase mode and a read mode. In different working modes, different operating voltages are required. Moreover, in case that the working mode is different, the operating cycle time is different. For applying the voltage driver to the non-volatile memory, the voltage driver needs to be specially designed.

SUMMARY OF THE INVENTION

An object of the present invention provides a voltage driver for a non-volatile memory. According to the working mode of the non-volatile, an operating voltage with proper driving power and accuracy is provided from the voltage driver to the memory cell.

An embodiment of the present invention provides a voltage driver. The voltage driver includes a voltage divider, a first transistor and a second transistor. The voltage divider is connected with a first voltage source and a second voltage source, and generates a first bias voltage. A drain terminal of the first transistor is connected with a third voltage source. A gate terminal of the first transistor is connected with the voltage divider to receive the first bias voltage. A drain terminal of the second transistor is connected with a source terminal of the first transistor. A gate terminal of the second transistor receives a second bias voltage. A source terminal of the second transistor is connected with a fourth voltage source. The first transistor and the second transistor are of the same conductivity type and match each other. The source terminal of the first transistor generates an output voltage.

Another embodiment of the present invention provides a voltage driver. The voltage driver is connected with a first voltage source, a second voltage source, a third voltage source, a fourth voltage source, a fifth voltage source and a sixth voltage source. The voltage driver includes a voltage divider, a first N-type transistor, a second N-type transistor, a first P-type transistor and a second P-type transistor. The voltage divider is connected with a first voltage source and a second voltage source, and generates a first bias voltage, a second bias voltage, a third bias voltage and a fourth bias voltage. A drain terminal of the first N-type transistor is connected with the third voltage source. A gate terminal of the first N-type transistor receives the first bias voltage. A drain terminal of the second N-type transistor is connected with a source terminal of the first N-type transistor. A gate terminal of the second N-type transistor receives the second bias voltage. A source terminal of the second N-type transistor is connected with the fifth voltage source. A drain terminal of the first P-type transistor is connected with the fourth voltage source. A gate terminal of the first P-type transistor receives the third bias voltage. A drain terminal of the second P-type transistor is connected with a source terminal of the first P-type transistor. A gate terminal of the second P-type transistor receives the fourth bias voltage. A source terminal of the second P-type transistor is connected with the sixth voltage source. The first N-type transistor and the N-type second transistor match each other in characteristics. The first P-type transistor and the P-type second transistor match each other in characteristics.

A further embodiment of the present invention provides a logic-based non-volatile memory. The logic-based non-volatile memory includes a memory cell and a voltage driver. The voltage driver is connected with the memory cell. The voltage driver includes a voltage divider, a first transistor and a second transistor. The voltage divider is connected with a first voltage source and a second voltage source, and generates a first bias voltage. A drain terminal of the first transistor is connected with a third voltage source. A gate terminal of the first transistor receives the first bias voltage. A drain terminal of the second transistor is connected with a source terminal of the first transistor. A gate terminal of the second transistor receives a second bias voltage. A source terminal of the second transistor is connected with a fourth voltage source. The first transistor and the second transistor are of the same conductivity type and match each other. The source terminal of the first transistor generates an output voltage to the memory cell. The second bias voltage is equal to a voltage level of the fourth voltage source with an offset of a specified voltage value. The first bias voltage is equal to a target voltage with an offset of the specified voltage value. The output voltage is equal to the target voltage.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1 (prior art) is a schematic functional block diagram illustrating the architecture of a non-volatile memory;

FIG. 2A is a schematic circuit diagram illustrating a voltage driver according to a first embodiment of the present invention;

FIG. 2B is a schematic circuit diagram illustrating a voltage divider of the voltage driver as shown in FIG. 2A;

DETAILED DESCRIPTION OF PREFERRED EMBODIMENTS

Figure 3A:
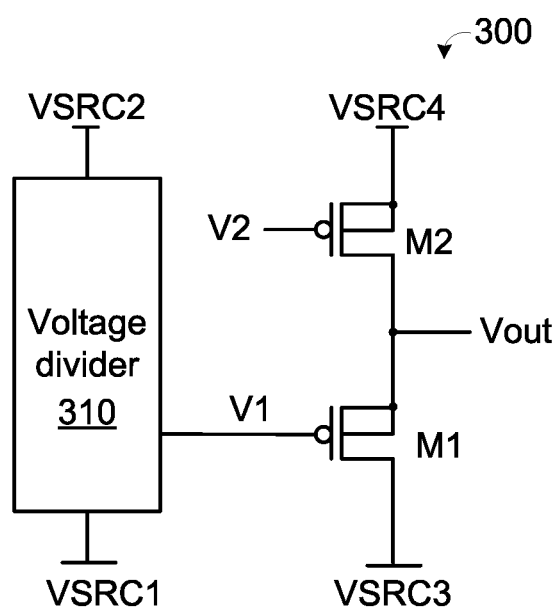
FIG. 3A is a schematic circuit diagram illustrating a voltage driver according to a second embodiment of the present invention.

FIG. 2A is a schematic circuit diagram illustrating a voltage driver according to a first embodiment of the present invention. FIG. 2B is a schematic circuit diagram illustrating a voltage divider of the voltage driver as shown in FIG. 2A. The voltage driver 200 comprises a voltage divider 210, a first transistor M1 and a second transistor M2. The voltage divider 210 is connected with a first voltage source VSRC1 and a second voltage source VSRC2 and generates a first bias voltage V1. The drain terminal of the first transistor M1 is connected with a third voltage source VSRC3. The gate terminal of the first transistor M1 is connected with the voltage divider 210 to receive the first bias voltage V1. The source terminal of the first transistor M1 generates an output voltage Vout. The drain terminal of the second transistor M2 is connected with the source terminal and the base terminal of the first transistor M1. The gate terminal of the second transistor M2 receives a second bias voltage V2. The source terminal and the base terminal of the second transistor M2 is connected with a fourth voltage source VSRC4.

In FIG. 2B, the circuitry of the voltage divider 210 is shown. The voltage divider 210 comprises transistors M3, M4 and M5. The drain terminal and the gate terminal of the transistor M3 are connected with the first voltage source VSRC1. The source terminal and the base terminal of the transistor M3 are connected with the node a. The drain terminal and the gate terminal of the transistor M4 are connected with the node a. The source terminal and the base terminal of the transistor M4 are connected with the node b. The drain terminal and the gate terminal of the transistor M5 are connected with the node b. The source terminal and the base terminal of the transistor M5 are connected with the second voltage source VSRC2. In this embodiment, the transistor M3, the transistor M4 and the transistor M5 are used as impedance elements (e.g., resistors). According to the impedance values of the transistor M3, the transistor M4 and the transistor M5, the first bias voltage V1 is outputted from the node a.

In this embodiment, the first transistor M1 and the second transistor M2 are of the same conductivity type. In addition, the first transistor M1 and the second transistor M2 are specially designed to match each other. Consequently, the component characteristics of these two transistors have the similar changing trends. For example, the first transistor M1 and the second transistor M2 have the same channel width and the same channel length. Moreover, the layout geometrical environments of the first transistor M1 and the second transistor M2 are nearly identical. For example, the placement directions, the numbers of the surrounding isolation structures, guard rings and contacts and the layout areas of the first transistor M1 and the second transistor M2 are identical. Moreover, the feature match properties (e.g., the symmetry and the dummy) of the analog circuit are used for designing the first transistor M1 and the second transistor M2.

Please refer to FIG. 2A again. The current I1 flowing through the first transistor M1 and current I2 flowing through the second transistor M2 are equal. When the first transistor M1 and the second transistor M2 are operated in a saturation region, the relationship between the current I2 and the current I1 may be expressed as:

$$I2=I1=K_2(Vgs_2-Vt_2)^2=K_1(Vgs_1-Vt_1)^2$$

In the above formula, $K_1$ and $K_2$ are conduction parameters of the first transistor M1 and the second transistor M2, respectively. In addition, $Vt_1$ and $Vt_2$ are threshold voltages of the first transistor M1 and the second transistor M2, respectively. Since the first transistor M1 and the second transistor M2 are of the same conductivity type and match each other, $K_2$ is equal to $K_1$ and $Vt_2$ is equal to $Vt_1$. In other words, the output voltage Vout can be calculated according to the following formulae:

$$Vout = V1 - Vgs_1$$
$$= V1 - \left(\sqrt{\frac{I1}{K_1}} + Vt_1\right)$$
$$= V1 - \left(\sqrt{\frac{K_2(Vgs_2 - Vt_2)^2}{K_1}} + Vt_1\right)$$
$$= V1 - \left(\sqrt{(Vgs_2 - Vt_2)^2} + Vt_1\right)$$
$$= V1 - (Vgs_2 - Vt_2 + Vt_1)$$
$$= V1 - Vgs_2$$

Please refer to FIG. 2A again. The second bias voltage V2 is a reference voltage Vref that is outputted from a bandgap circuit or a voltage regulator of the non-volatile memory. For example, the reference voltage Vref is 1.2V. Moreover, the reference voltage Vref is not largely influenced by the manufacturing process and the temperature. That is, the second bias voltage V2 is equal to the second voltage source VSRC2 with the offset of the reference voltage Vref. Moreover, the first voltage source VSRC1 and the third voltage source VSRC3 provide the high voltages Vpp, and the second voltage source VSRC2 and the fourth voltage source VSRC4 provide the ground voltages Vss. Generally, for use with the subsequent circuit (e.g., the non-volatile memory), the output voltage Vout from the voltage driver 200 has to reach a target voltage Vtarget. By properly selecting the sizes of the transistors M3, M4 and M5 of the voltage driver 200, the first bias voltage V1 is equal to the sum of the target voltage Vtarget and the reference voltage Vref. That is, V1=Vtarget+Vref. Since the first transistor M1 is used as a source follower, the output voltage Vout from the voltage driver 200 is equal to the target voltage Vtarget. The relationship between the output voltage Vout and the target voltage Vtarget will be deduced by the following formulae:

$$Vout = V1 - Vgs_2$$
$$= (Vtarget + Vref) - (V2 - 0)$$
$$= Vtarget + Vref - Vref$$
$$= Vtarget$$

It is noted that numerous modifications and alterations may be made while retaining the teachings of the invention. For complying with different voltage demands of the first voltage source VSRC1 and the target voltage Vtarget, the voltage divider 210 comprises more than three transistors. Moreover, the first bias voltage V1 is outputted from a proper node to the first transistor M1 such that the output voltage Vout is equal to the target voltage Vtarget.

Figure 3B:
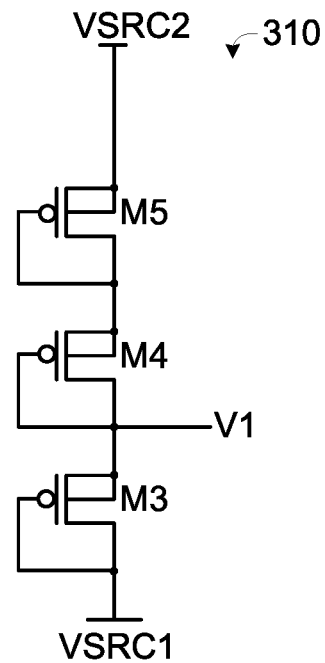
FIG. 3B is a schematic circuit diagram illustrating a voltage divider of the voltage driver as shown in FIG. 3A.

In the first embodiment of FIGS. 2A and 2B, the transistors M1, M2, M3, M4 and M5 are N-type transistors. FIG. 3A is a schematic circuit diagram illustrating a voltage driver according to a second embodiment of the present invention. FIG. 3B is a schematic circuit diagram illustrating a voltage divider of the voltage driver as shown in FIG. 3A. In comparison with the first embodiment, the transistors M1, M2, M3, M4 and M5 of this embodiment are P-type transistors. In this embodiment, the first voltage source VSRC1 and the third voltage source VSRC3 provide the ground voltages Vss, and the second voltage source VSRC2 and the fourth voltage source VSRC4 provide the high voltages Vpp. The approximate voltage level of the second bias voltage V2 is obtained by subtracting the reference voltage Vref from the high voltages Vpp. The voltage divider 310 is specially designed. Consequently, the approximate voltage level of the first bias voltage V1 is obtained by subtracting the reference voltage Vref from the target voltage Vtarget. Since the first transistor M1 is used as a source follower, the output voltage Vout from the voltage driver 300 is equal to the target voltage Vtarget.

Figure 4A:
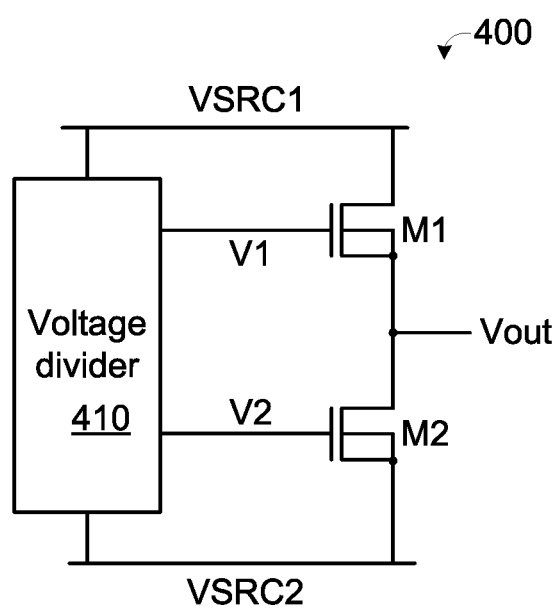
FIG. 4A is a schematic circuit diagram illustrating a voltage driver according to a third embodiment of the present invention.
Figure 4B:
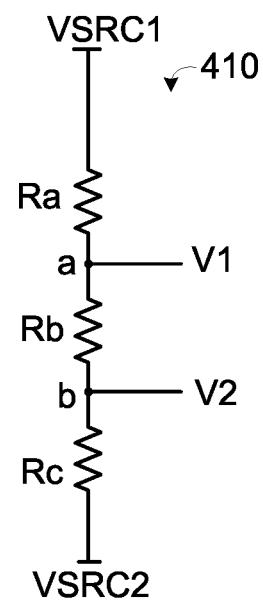
FIG. 4B is a schematic circuit diagram illustrating an exemplary voltage divider used in the voltage driver of FIG. 4A.

FIG. 4A is a schematic circuit diagram illustrating a voltage driver according to a third embodiment of the present invention. FIG. 4B is a schematic circuit diagram illustrating an exemplary voltage divider used in the voltage driver of FIG. 4A. As shown in FIG. 4A, the voltage driver 400 comprises a voltage divider 410, a first transistor M1 and a second transistor M2. The voltage divider 410 is connected with a first voltage source VSRC1 and a second voltage source VSRC2. Moreover, the voltage divider 410 generates a first bias voltage V1 and a second bias voltage V2. The drain terminal of the first transistor M1 is connected with the first voltage source VSRC1. The gate terminal of the first transistor M1 receives the first bias voltage V1. The source terminal of the first transistor M1 generates an output voltage Vout. The drain terminal of the second transistor M2 is connected with the source terminal and the base terminal of the first transistor M1. The gate terminal of the second transistor M2 receives the second bias voltage V2. The source terminal and the base terminal of the second transistor M2 is connected with the second voltage source VSRC2.

In FIG. 4B, the circuitry of the voltage divider 410 is shown. The voltage divider 410 comprises a first resistor Ra, a second resistor Rb and a third resistor Rc. A first terminal of the first resistor Ra is connected with the first voltage source VSRC1. A second terminal of the first resistor Ra is connected with the node a. A first terminal of the second resistor Rb is connected with the node a. A second terminal of the second resistor Rb is connected with the node b. A first terminal of the third resistor Rc is connected with the node b. A second terminal of the third resistor Rc is connected with the second voltage source VSRC2. The first bias voltage V1 is outputted from the node a. The second bias voltage V2 is outputted from the node b.

Figure 4C:
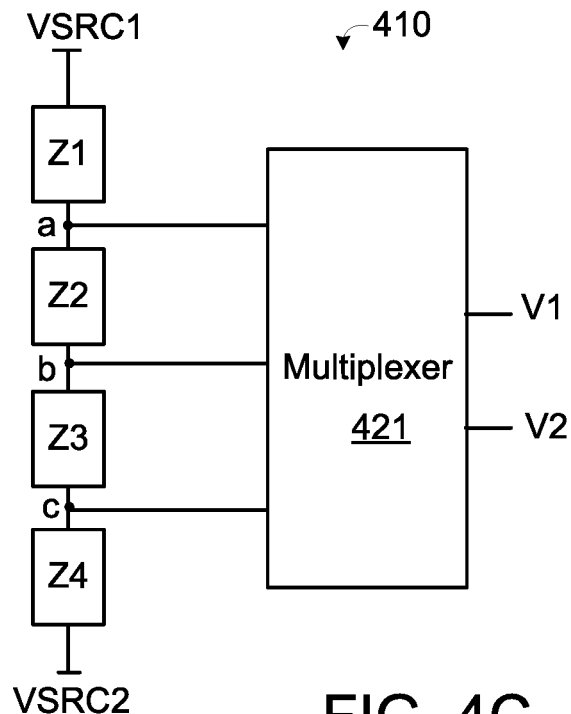
FIG. 4C is a schematic circuit diagram illustrating another exemplary voltage divider used in the voltage driver of FIG. 4A.

FIG. 4C is a schematic circuit diagram illustrating another exemplary voltage divider used in the voltage driver of FIG. 4A. In this embodiment, the voltage divider 410 is connected with a first voltage source VSRC1 and a second voltage source VSRC2. Moreover, the voltage divider 410 generates a first bias voltage V1 and a second bias voltage V2. The voltage divider 410 comprises a first impedance element Z1, a second impedance element Z2, a third impedance element Z3, a fourth impedance element Z4 and a multiplexer 421. A first terminal of the first impedance element Z1 is connected with the first voltage source VSRC1. A second terminal of the first impedance element Z1 is connected with the node a. A first terminal of the second impedance element Z2 is connected with the node a. A second terminal of the second impedance element Z2 is connected with the node b. A first terminal of the third impedance element Z3 is connected with the node b. A second terminal of the third impedance element Z3 is connected with the node c. A first terminal of the fourth impedance element Z4 is connected with the node c. A second terminal of the fourth impedance element Z4 is connected with the second voltage source VSRC2. The three input terminals of the multiplexer 421 are connected with the node a, the node b and the node c, respectively. The first bias voltage V1 is outputted from a first output terminal of the multiplexer 421. The second bias voltage V2 is outputted from a second output terminal of the multiplexer 421. It is noted that the numbers of the impedance elements and the multiplexer are not restricted. That is, the numbers of these components may be varied according to the practical requirements.

For example, the impedance element is a resistor, a capacitor, an inductor, an N-type transistor, a P-type transistor or a switched-capacitor. The sizes of the impedance elements Z1, Z2, Z3 and Z4 may be identical or different. Consequently, these impedance elements can acquire the required divided voltages between the first voltage source VSRC1 and the second voltage source VSRC2.

Generally, the non-volatile memory in the program mode and the non-volatile memory need different voltages. According to the working mode, the required voltages are inputted into the input terminals of the multiplexer 421, and the first bias voltage V1 and the second bias voltage V2 are outputted from the two output terminals of the multiplexer 421.

In this embodiment, the difference between the second bias voltage V2 and the voltage level of the second voltage source VSRC2 (i.e., the gate-source voltage $Vgs_2$ of the second transistor M2) needs to be greater than the threshold voltage $Vt_2$ of the second transistor M2. Consequently, the second transistor M2 is certainly operated in the saturation region. The operating principles of the other components are similar to those of the voltage driver 200, and are not redundantly described herein.

However, if the voltage across the drain terminal and the source terminal of the transistor is very large, the current characteristics of the saturation region are not as ideal as the above formulae because of the channel length modulation effect. Consequently, the voltage driver needs to be further modified. For example, the voltage driver of FIG. 5 can overcome the above drawbacks.

Figure 5:
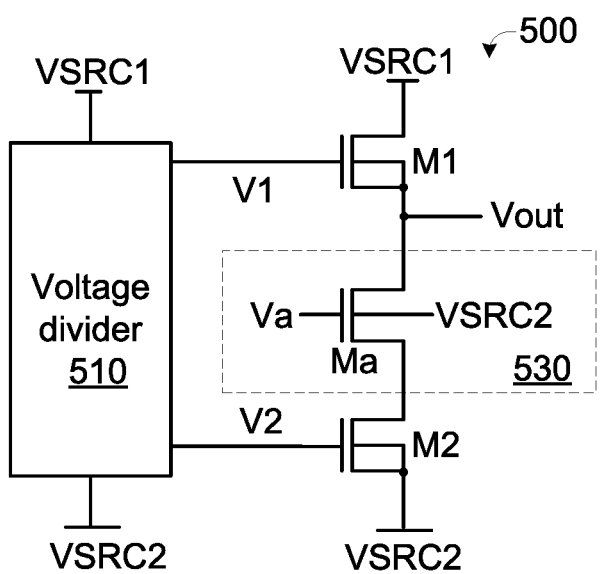
FIG. 5 is a schematic circuit diagram illustrating a voltage driver according to a fourth embodiment of the present invention.

FIG. 5 is a schematic circuit diagram illustrating a voltage driver according to a fourth embodiment of the present invention. As shown in FIG. 5, the voltage driver 500 comprises a voltage divider 510, a first transistor M1, a second transistor M2 and a resistive element 530. The voltage divider 510 is connected with a first voltage source VSRC1 and a second voltage source VSRC2. Moreover, the voltage divider 510 generates a first bias voltage V1 and a second bias voltage V2. The drain terminal of the first transistor M1 is connected with the first voltage source VSRC1. The gate terminal of the first transistor M1 receives the first bias voltage V1. The source terminal of the first transistor M1 generates an output voltage Vout. A first terminal of the resistive element 530 is connected with the source terminal and the base terminal of the first transistor M1. The first transistor M1 and the second transistor M2 are of the same conductivity type and match each other. The drain terminal of the second transistor M2 is connected with a second terminal of the resistive element 530. The gate terminal of the second transistor M2 receives the second bias voltage V2. The source terminal and the base terminal of the second transistor M2 is connected with the second voltage source VSRC2. The structure of the voltage divider 510 is identical to the structure of the voltage divider as shown in FIG. 4B or FIG. 4C.

In case that the difference between the output voltage Vout and the voltage level of the second voltage source VSRC2 is very large, the resistive element 530 is properly selected. Consequently, the drain-source voltage $Vds_1$ of the first transistor M1 and the drain-source voltage $Vds_2$ of the second transistor M2 are equal. Since the drain-source voltage $Vds_1$ and the drain-source voltage $Vds_2$ are equal, the drain-source voltage $Vds_2$ is not too large. Under this circumstance, the influence of the channel length modulation effect is reduced.

As shown in FIG. 5, the resistive element 530 comprises a transistor Ma. The gate terminal of the transistor Ma receives a bias voltage Va. The base terminal of the transistor Ma is connected with the second voltage source VSRC2. The drain terminal and the source terminal of the transistor Ma are served as the first terminal and the second terminal of the resistive element 530, respectively. According to the magnitudes of the first voltage source VSRC1, the second voltage source VSRC2 and the output voltage Vout in different working modes, the magnitude of the bias voltage Va is correspondingly adjusted. Consequently, the drain-source voltage $Vds_1$ and the drain-source voltage $Vds_2$ are equal. In some other embodiments, the resistive element 530 includes the component other than the transistor. According to the magnitudes of the first voltage source VSRC1, the second voltage source VSRC2 and the output voltage Vout and the drain-source current $Ids_2$ of the second transistor M2, the drain-source voltage $Vds_1$ of the first transistor M1 and the drain-source voltage $Vds_2$ of the second transistor M2 are equal. Consequently, the gate-source voltage $Vgs_1$ of the first transistor M1 and the gate-source voltage $Vgs_2$ of the second transistor M2 are equal.

Figure 6A:
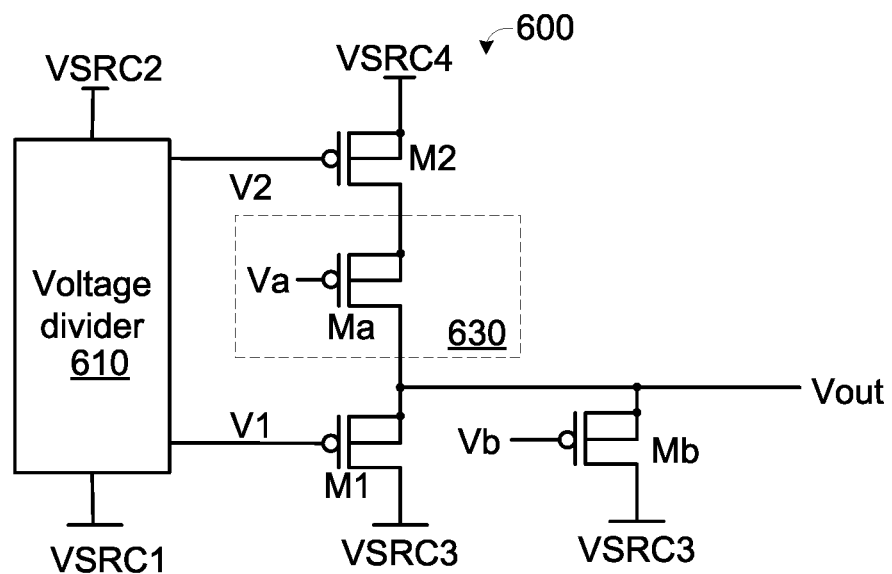
FIG. 6A is a schematic circuit diagram illustrating a voltage driver according to a fifth embodiment of the present invention.

FIG. 6A is a schematic circuit diagram illustrating a voltage driver according to a fifth embodiment of the present invention. As shown in FIG. 6A, the voltage driver 600 comprises a voltage divider 610, a first transistor M1, a second transistor M2, a third transistor Mb and a resistive element 630. The structure of the voltage divider 610 is identical to the structure of the voltage divider as shown in FIG. 4B or FIG. 4C.

In this embodiment, the first voltage source VSRC1 and the third voltage source VSRC3 provide the ground voltages Vss, and the second voltage source VSRC2 and the fourth voltage source VSRC4 provide the high voltages Vpp. The drain terminal of the third transistor Mb is connected with the third voltage source VSRC3. The gate terminal of the third transistor Mb receives a bias voltage Vb. The source terminal and the base terminal of the third transistor Mb are connected with the source terminal of the first transistor M1. Due to the arrangement of the third transistor Mb, the output voltage Vout reaches the target voltage Vtarget faster. Before the output voltage Vout reaches the target voltage Vtarget, the third transistor Mb is turned on. When the output voltage Vout reaches the target voltage Vtarget, the third transistor Mb is turned off. In other words, the relationship between the bias voltage Vb and the target voltage Vtarget may be expressed as: Vb<Vtarget and Vtarget−Vb<|$Vt_b$|, wherein $Vt_b$ is a threshold voltage of the third transistor Mb.

In some other embodiments, the base terminal of the third transistor Mb is connected with the second voltage source VSRC2.

Figure 6B:
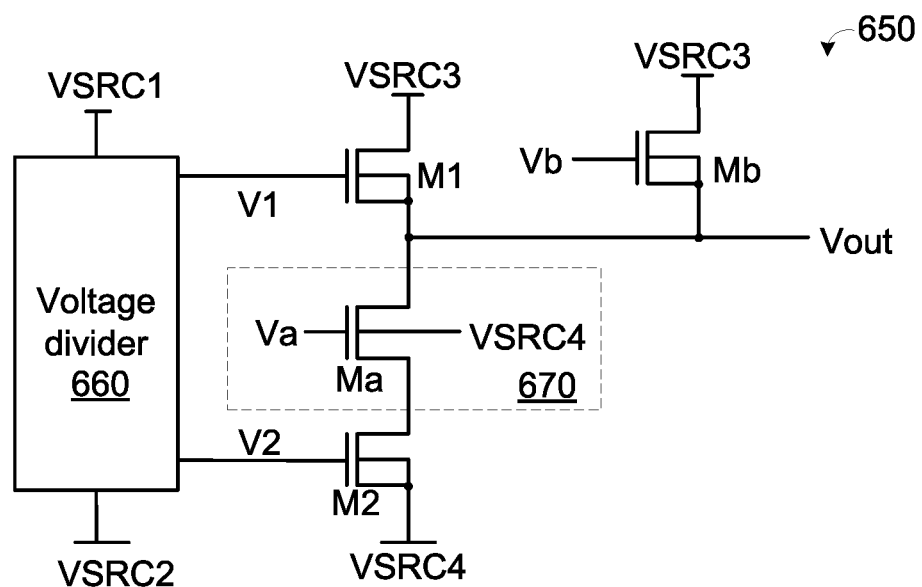
FIG. 6B is a schematic circuit diagram illustrating a variant example of the voltage driver as shown in FIG. 6A.

In the embodiment of FIG. 6A, the transistors Ml, M2, Ma and Mb are P-type transistors. FIG. 6B is a schematic circuit diagram illustrating a variant example of the voltage driver as shown in FIG. 6A. In this example, the transistors M1, M2, Ma and Mb are N-type transistors. As shown in FIG. 6B, the voltage driver 650 comprises a voltage divider 660, a first transistor M1, a second transistor M2, a third transistor Mb and a resistive element 670. The structure of the voltage divider 660 is identical to the structure of the voltage divider as shown in FIG. 4B or FIG. 4C. In this embodiment, the first voltage source VSRC1 and the third voltage source VSRC3 provide the high voltages Vpp, and the second voltage source VSRC2 and the fourth voltage source VSRC4 provide the ground voltages Vss. The relationship between the bias voltage Vb and the target voltage Vtarget may be expressed as: Vb>Vtarget and Vb−Vtarget<$Vt_b$, wherein $Vt_b$ is a threshold voltage of the third transistor Mb.

In some situations, the pull-up capability and the pull-down capability of the N-type transistor and the P-type transistor are different. Under this circumstance, the voltage driver comprises N-type source followers and P-type source followers simultaneously.

Figure 7:
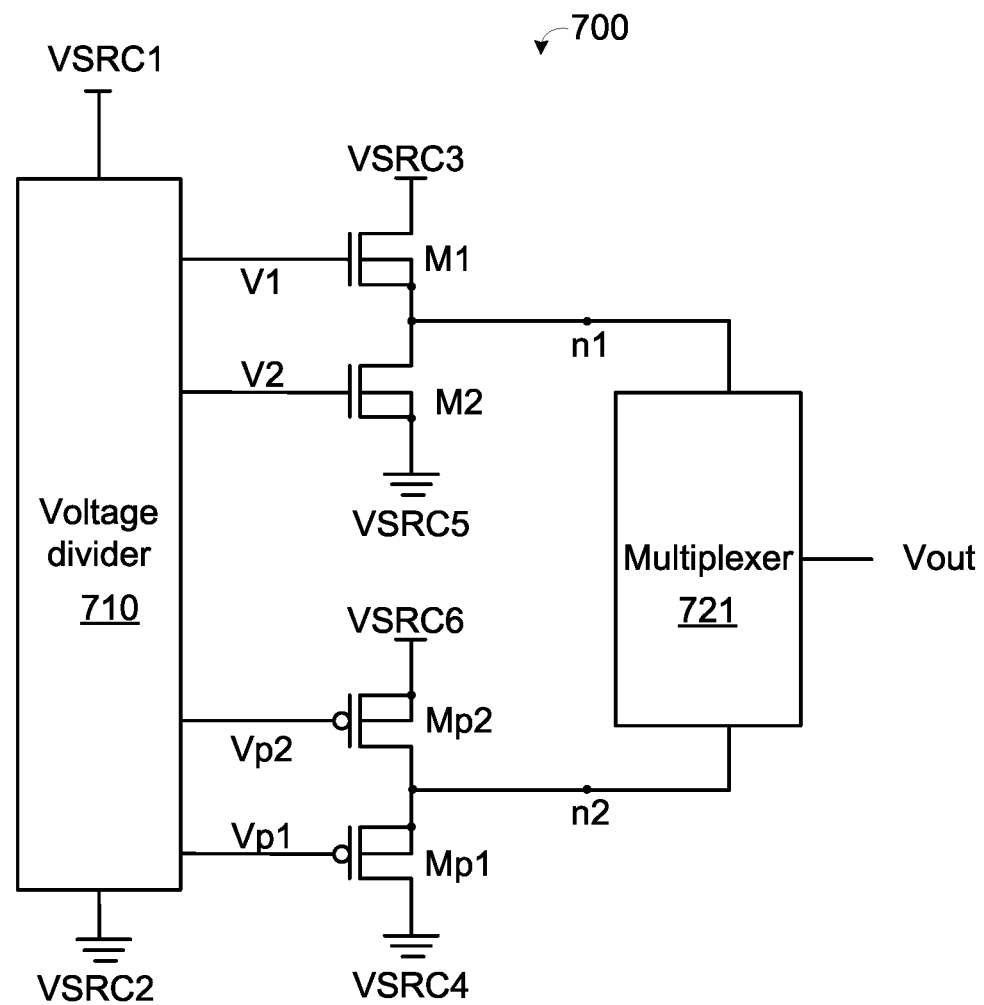
FIG. 7 is a schematic circuit diagram illustrating a voltage driver according to a sixth embodiment of the present invention.

FIG. 7 is a schematic circuit diagram illustrating a voltage driver according to a sixth embodiment of the present invention. The voltage driver 700 comprises a voltage divider 710, transistors M1, M2, Mp1, Mp2, and a multiplexer 721. The voltage divider 710 is connected with a first voltage source VSRC1 and a second voltage source VSRC2. Moreover, the voltage divider 710 generates a first bias voltage V1, a second bias voltage V2, a third bias voltage Vp1 and a fourth bias voltage Vp2. The drain terminal of the transistor M1 is connected with a third voltage source VSRC3. The gate terminal of the transistor M1 receives the first bias voltage V1. The source terminal and the base terminal of the transistor M1 are connected with the node n1. The transistors M1 and M2 match each other. The drain terminal of the transistor M2 is connected with the node n1. The gate terminal of the transistor M2 receives the second bias voltage V2. The source terminal and the base terminal of the transistor M2 are connected with a fifth voltage source VSRC5. The source terminal and the base terminal of the transistor Mp1 are connected with the node n2. The gate terminal of the transistor Mp1 receives the third bias voltage Vp1. The drain terminal of the transistor Mp1 is connected with a fourth voltage source VSRC4. The transistors Mp1 and Mp2 match each other. The source terminal and the base terminal of the transistor Mp2 are connected with a sixth voltage source VSRC6. The gate terminal of the transistor Mp2 receives the fourth bias voltage Vp2. The drain terminal of the transistor Mp2 is connected with the node n2. The two input terminals of the multiplexer 721 are connected with the node n1 and the node n2, respectively. The output voltage Vout is outputted from the output terminal of the multiplexer 721. According to the working mode, the inner switch of the multiplexer 721 is selectively switched. Consequently, the voltage at the node n1 or the voltage at the node n2 is selected as the output voltage Vout and outputted from the output terminal of the multiplexer 721. In an embodiment, the first voltage source VSRC1, the third voltage source VSRC3 and the sixth voltage source VSRC6 are connected with the same voltage source to receive the high voltages Vpp, and the second voltage source VSRC2, the fourth voltage source VSRC4 and the fifth voltage source VSRC5 are connected with the same voltage source to receive the ground voltages Vss.

During the operation of the voltage driver 700, the states of the transistors M1 and M2 and the states of the transistors Mp1 and Mp2 are different. For example, in case that the transistors M1 and M2 are turned on, the transistors Mp1 and Mp2 are turned off. In case that the transistors Mp1 and Mp2 are turned on, the transistors M1 and M2 are turned off.

Figure 8B:
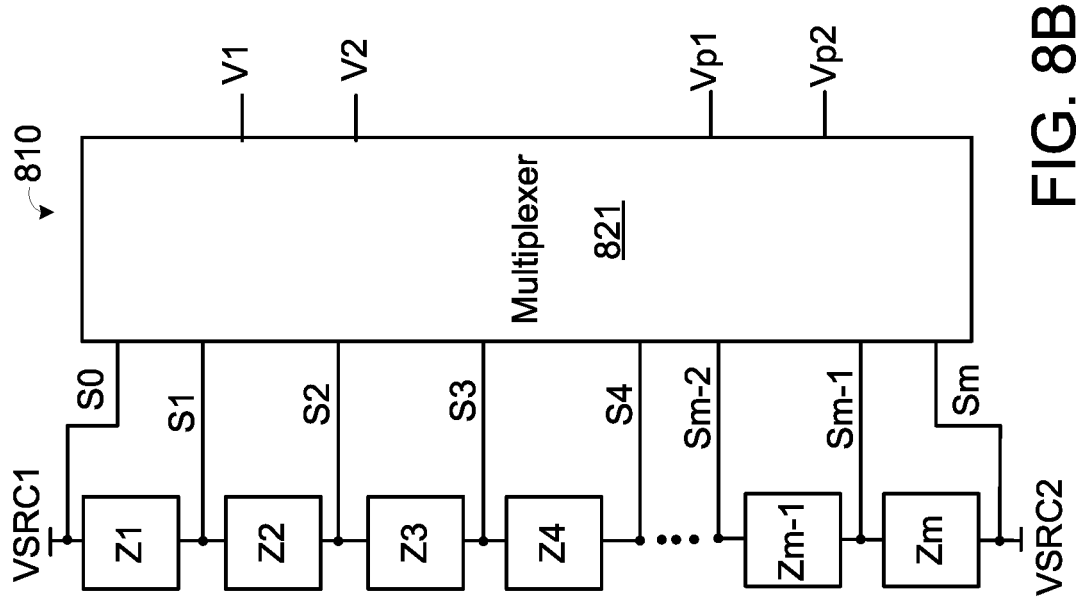
FIG. 8B is a schematic circuit diagram illustrating a voltage divider of the voltage driver as shown in FIG. 8A.
Figure 8A:
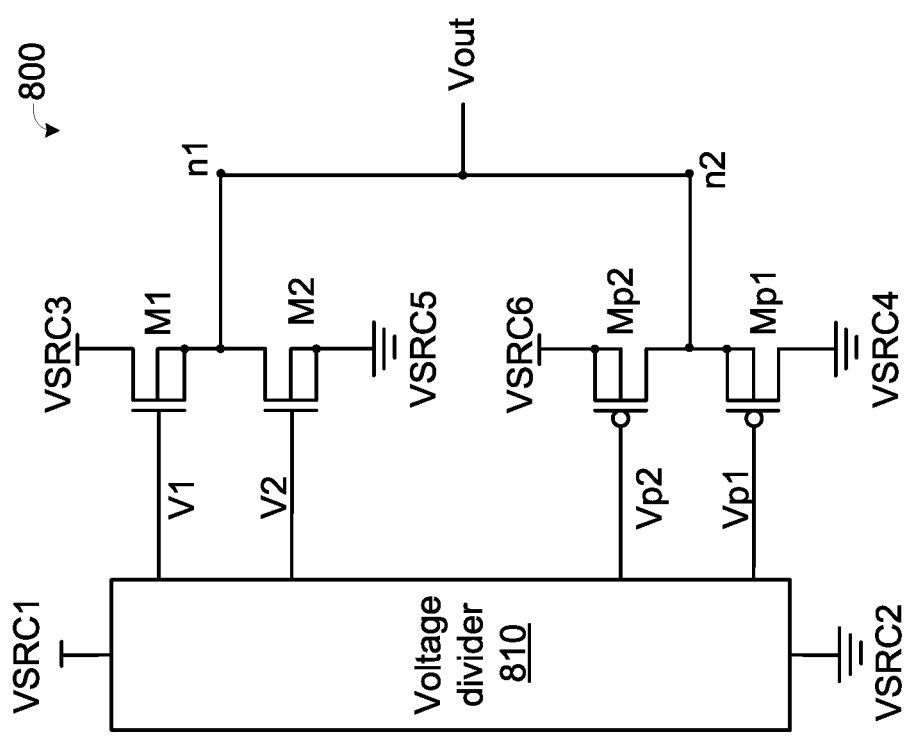
FIG. 8A is a schematic circuit diagram illustrating a voltage driver according to a seventh embodiment of the present invention.

FIG. 8A is a schematic circuit diagram illustrating a voltage driver according to a seventh embodiment of the present invention. FIG. 8B is a schematic circuit diagram illustrating a voltage divider of the voltage driver as shown in FIG. 8A. The voltage driver 800 comprises a voltage divider 810 and transistors M1, M2, Mp1 and Mp2. In comparison with the sixth embodiment, the multiplexer is included in the voltage divider 810, and the node n1 and the node n2 are connected with each other to generate the output voltage Vout.

In FIG. 8B, the circuitry of the voltage divider 810 is shown. The voltage divider 810 comprises m impedance elements Z1~Zm and a multiplexer 821. The m impedance elements Z1~Zm are connected between a first voltage source VSRC1 and a second voltage source VSRC2. Consequently, (m+1) output bias voltages S0~Sm are provided to the multiplexer 821. According to the (m+1) output bias voltages S0~Sm, the multiplexer 821 generates a first bias voltage V1, a second bias voltage V2, a third bias voltage Vp1 and a fourth bias voltage Vp2.

In case that the transistors M1 and M2 are turned on, the transistors Mp1 and Mp2 are turned off. Whereas, in case that the transistors Mp1 and Mp2 are turned on, the transistors M1 and M2 are turned off. When the first voltage source VSRC1, the third voltage source VSRC3 and the sixth voltage source VSRC6 receive the high voltages Vpp, the second voltage source VSRC2, the fourth voltage source VSRC4 and the fifth voltage source VSRC5 receive the ground voltages Vss. The second bias voltage V2 is higher than the threshold voltage $Vt_2$ of the second transistor M2. The first bias voltage V1 is equal to the sum of the second bias voltage V2 and the target voltage Vtarget. The third bias voltage Vp1 and the fourth bias voltage Vp2 are higher than the high voltage Vpp. Consequently, the output voltage Vout is equal to the target Vtarget.

From the above descriptions, the present invention provides a voltage driver with a novel structure. When the voltage driver is applied to a non-volatile memory, the voltage driver provides the corresponding operating voltage to the non-volatile cell array.

Generally, a logic-based non-volatile memory (Logic NVM) comprises a coupling capacitor Cp or a tunneling capacitor Ce for receiving the high voltage. Consequently, in the program mode or the erase mode, the hot carriers are injected into or ejected from the floating gate of the floating gate transistor.

In different working modes, the coupling capacitor Cp or the tunneling capacitor Ce receive different operating voltages. For example, in the program mode, the erase mode and the read mode, the coupling capacitor Cp or the tunneling capacitor Ce receive the operating voltages of 15V, 3.5V and 2.2V, respectively.

Figure 9A:
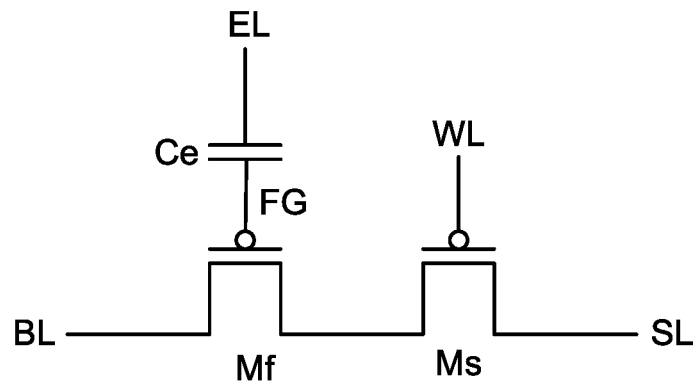
FIG. 9A is a schematic circuit diagram illustrating a memory cell of a logic-based non-volatile memory according to an embodiment of the present invention.

FIG. 9A is a schematic circuit diagram illustrating a memory cell of a logic-based non-volatile memory according to an embodiment of the present invention. The memory cell of the logic-based non-volatile memory comprises a select transistor Ms, a floating gate transistor Mf and a tunneling capacitor Ce. The gate terminal of the select transistor Ms is connected with a word line. The source terminal of the select transistor Ms is connected with a source line SL. The source terminal of the floating gate transistor Mf is connected with the drain terminal of the select transistor Ms. The drain terminal of the floating gate transistor Mf is connected with a bit line BL. The floating gate transistor Mf has a floating gate FG. A first terminal of the tunneling capacitor Ce is connected with the floating gate FG of the floating gate transistor Mf. A second terminal of the tunneling capacitor Ce is connected with an erase line EL. During the program cycle or the read cycle, the erase line EL receives the output voltage Vout from the voltage driver of the present invention.

Figure 9B:
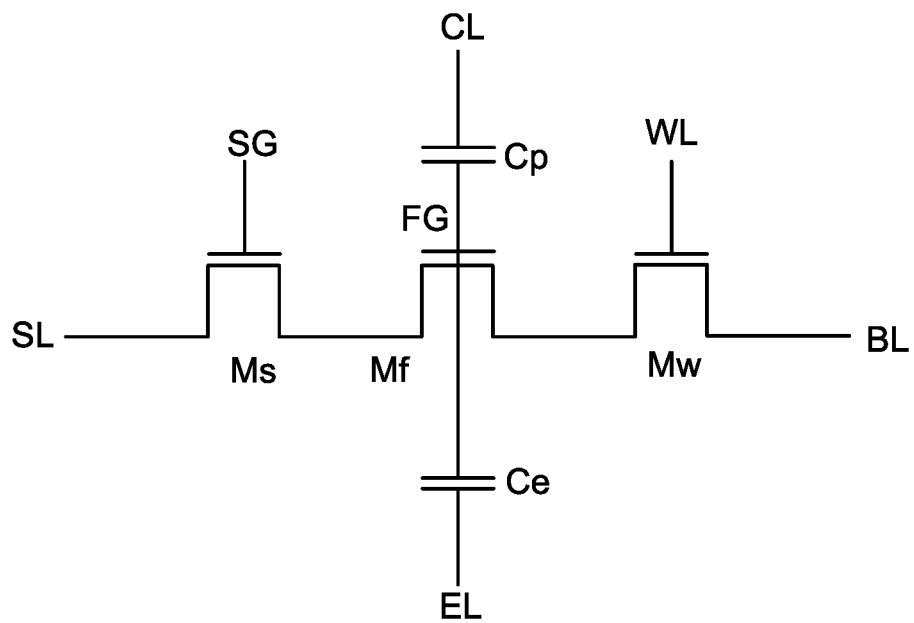
FIG. 9B is a schematic circuit diagram illustrating a memory cell of a logic-based non-volatile memory according to another embodiment of the present invention.

FIG. 9B is a schematic circuit diagram illustrating a memory cell of a logic-based non-volatile memory according to another embodiment of the present invention. The memory cell of the logic-based non-volatile memory comprises a first select transistor Ms, a floating gate transistor Mf, a second select transistor Mw, a tunneling capacitor Ce and a coupling capacitor Cp. The gate terminal of the first select transistor Ms is connected with a select line SG. The source terminal of the first select transistor Ms is connected with a source line SL. The source terminal of the floating gate transistor Mf is connected with the drain terminal of the first select transistor Ms. The gate terminal of the second select transistor Mw is connected with a word line WL. The source terminal of the second select transistor Mw is connected with the drain terminal of the floating gate transistor Mf. The drain terminal of the second select transistor Mw is connected with a bit line BL. A first terminal of the tunneling capacitor Ce is connected with a floating gate FG of the floating gate transistor Mf. A second terminal of the tunneling capacitor Ce is connected with an erase line EL. A first terminal of the coupling capacitor Cp is connected with the floating gate FG of the floating gate transistor Mf. A second terminal of the coupling capacitor Cp is connected with a control line CL. During the program cycle or the read cycle, the erase line EL or the control line CL is connected with the voltage driver to receive the output voltage.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A voltage driver, comprising:
a voltage divider connected with a first voltage source and a second voltage source, and generating a first bias voltage;
a first transistor, wherein a drain terminal of the first transistor is connected with a third voltage source, a gate terminal of the first transistor is connected with the voltage divider to receive the first bias voltage, and a source terminal of the first transistor generates an output voltage;
a second transistor, wherein a drain terminal of the second transistor is connected with the source terminal of the first transistor, a gate terminal of the second transistor receives a second bias voltage, and a source terminal of the second transistor is connected with a fourth voltage source; and
a third transistor, wherein a drain terminal of the third transistor is connected with the third voltage source, a gate terminal of the third transistor receives a third bias voltage, and a source terminal of the third transistor are connected with the source terminal of the first transistor;
wherein the first transistor, the second transistor and the third transistor are N-type transistors, each of the first voltage source and the third voltage source provides a high voltage, and each of the second voltage source and the fourth voltage source provides a ground voltage, wherein the second bias voltage is higher than a threshold voltage of the second transistor, the first bias voltage is equal to a sum of the second bias voltage and a target voltage, wherein the first transistor is used as a source follower, so that the output voltage is equal to the target voltage.

2. A voltage driver, comprising:
a voltage divider connected with a first voltage source and a second voltage source, and generating a first bias voltage;
a first transistor, wherein a drain terminal of the first transistor is connected with a third voltage source, a gate terminal of the first transistor is connected with the voltage divider to receive the first bias voltage, and a source terminal of the first transistor generates an output voltage;
a second transistor, wherein a drain terminal of the second transistor is connected with the source terminal of the first transistor, a gate terminal of the second transistor receives a second bias voltage, and a source terminal of the second transistor is connected with a fourth voltage source; and
a third transistor, wherein a drain terminal of the third transistor is connected with a third voltage source, a gate terminal of the third transistor receives a third bias voltage, and a source terminal of the third transistor are connected with the source terminal of the first transistor;
wherein the first transistor, the second transistor and the third transistor are P-type transistors, each of the first voltage source and the third voltage source provides a ground voltage, and each of the second voltage source and the fourth voltage source provides a high voltage, wherein the second bias voltage is equal to the high voltage with an offset of a threshold voltage of the second transistor, the first bias voltage is equal to a target voltage with an offset of a threshold voltage of the first transistor, the high voltage is higher than the second bias voltage, and the target voltage is higher than the first bias voltage, wherein the first transistor is used as a source follower, so that the output voltage is equal to the target voltage.

3. A voltage driver connected with a first voltage source, a second voltage source, a third voltage source, a fourth voltage source, a fifth voltage source and a sixth voltage source, the voltage driver comprising:
a voltage divider connected with a first voltage source and a second voltage source, and generating a first bias voltage, a second bias voltage, a third bias voltage and a fourth bias voltage;
a first N-type transistor, wherein a drain terminal of the first N-type transistor is connected with the third voltage source, and a gate terminal of the first N-type transistor receives the first bias voltage;
a second N-type transistor, wherein a drain terminal of the second N-type transistor is connected with a source terminal of the first N-type transistor, a gate terminal of the second N-type transistor receives the second bias voltage, and a source terminal of the second N-type transistor is connected with the fifth voltage source;
a first P-type transistor, wherein a drain terminal of the first P-type transistor is connected with the fourth voltage source, and a gate terminal of the first P-type transistor receives the third bias voltage; and
a second P-type transistor, wherein a drain terminal of the second P-type transistor is connected with a source terminal of the first P-type transistor, a gate terminal of the second P-type transistor receives the fourth bias voltage, and a source terminal of the second P-type transistor is connected with the sixth voltage source,
wherein the first N-type transistor and the N-type second transistor match each other in characteristics, and the first P-type transistor and the P-type second transistor match each other in characteristics.

4. The voltage driver as claimed in claim 3, wherein the voltage driver further comprises a multiplexer, wherein a first input terminal of the multiplexer is connected with the source terminal of the first N-type transistor, a second input terminal of the multiplexer is connected with the source terminal of the first P-type transistor, and an output terminal of the multiplexer generates an output voltage.

5. The voltage driver as claimed in claim 3, wherein the source terminal of the first N-type transistor and the source terminal of the first P-type transistor are connected with each other to generate an output voltage.

* * * * *